(12) United States Patent  
Snoeij et al.

(10) Patent No.: US 7,924,207 B2  
(45) Date of Patent: Apr. 12, 2011

(54) SINGLE SLOPE ANALOG-TO-DIGITAL CONVERTER

(75) Inventors: Martijn F. Snoeij, Delft (NL); Adrianus J. Mierop, Dirksland (NL); Albert J. P. Theuwissen, Bree (BE); Johannes H. Huijsing, Midden-Delfland (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 97 days.

(21) Appl. No.: 12/438,590

(22) PCT Filed: Aug. 22, 2007

(86) PCT No.: PCT/IB2007/053344  
§ 371 (c)(1),  
(2), (4) Date: Feb. 24, 2009

(87) PCT Pub. No.: WO2008/026129  
PCT Pub. Date: Mar. 6, 2008

(65) Prior Publication Data  
US 2009/0195431 A1    Aug. 6, 2009

(30) Foreign Application Priority Data  
Aug. 31, 2006  (EP) .................... 06119903

(51) Int. Cl.  
*H03M 1/56* (2006.01)  
(52) U.S. Cl. ...................... 341/169; 341/155  
(58) Field of Classification Search .......... 341/155, 341/144, 141, 169, 164  
See application file for complete search history.

(56) References Cited

U.S. PATENT DOCUMENTS

| 4,485,372 | A | 11/1984 | Holloway |
| 5,321,404 | A | 6/1994 | Mallinson et al. |
| 5,963,044 | A * | 10/1999 | Schafer ............ 324/713 |
| 6,346,907 | B1 | 2/2002 | Dacy et al. |
| 6,545,624 | B2 * | 4/2003 | Lee et al. .......... 341/155 |
| 6,670,904 | B1 * | 12/2003 | Yakovlev .......... 341/167 |
| 6,693,575 | B1 * | 2/2004 | Yang et al. ........ 341/155 |
| 2002/0067303 | A1 | 6/2002 | Lee et al. |
| 2009/0066554 | A1 * | 3/2009 | Lim ................. 341/155 |

OTHER PUBLICATIONS

Sasaki M et al: "A wide dynamic range CMOS image sensor with multiple short-time exposures" Sensors, 2004. Proceedings of IEEE Vienna, Austria Oct. 24-27, 2004, Piscataway, NJ, USA,IEEE, Oct. 24, 2004, pp. 967-972, XP010793568 ISBN: 0-7803-8692-2.  
MAXIM; Multi-Slope Integrating ADCs May 2, 2002, Application Note 1041: pp. 1-7 http://www.maxim-ic.com/appnotes.cfm/appnote_number/1041.  
Jia Kang Shu, et al; WPM P-2.06, An ADC with Differential Mode for CMOS Image Sensor, 2001 IEEE, International Conference on Consumer Electronics 2001 Digest of Technical Papers. ICCE. Los Angeles, CA, Jun. 19-21, 2001, New York, NY: IEEE, US pp. 190-191, ISBN 0-7803-6622-0.

* cited by examiner

*Primary Examiner* — Peguy JeanPierre

(57) ABSTRACT

A single-slope ADC, particularly suitable for use in a massive-parallel ADC architecture in a readout circuit of a CMOS imager. A plurality of ramp signals are generated which define non-overlapping sub-ranges of the full input range. For each ADC channel, the sub-range in which the voltage of the input signal falls is determined, and the corresponding ramp signal is selected for use in the A/D conversion. Thus, the speed of the A/D conversion process can be increased and the power consumption decreased.

12 Claims, 4 Drawing Sheets

US 7,924,207 B2

SINGLE SLOPE ANALOG-TO-DIGITAL CONVERTER

FIELD OF THE INVENTION

This invention relates to a single slope analog-to-digital converter (ADC) particularly, but not necessarily exclusively, suited for use in the read-out circuitry of a CMOS imager.

BACKGROUND OF THE INVENTION

In order to read out an image captured by a CMOS imager, readout circuitry is generally co-integrated on the same chip as the image sensor itself, thus creating a camera-on-chip which is highly suitable for mobile applications, such as mobile telephones, personal digital assistants (PDAs), and the like. An important component of the readout circuitry of a CMOS imager is the analog-to-digital converter (ADC) to convert the output of the imaging array into the digital domain. Such conversion can be implemented with a single ADC that converts the output signal of the complete imaging array into the digital domain. The advantage of this single-channel solution is that it ensures a uniform A/D conversion for the whole imaging array and, as only a single ADC is used, it uses relatively little chip area. However, such an ADC must operate at the speed dictated by the application and therefore implementing an on-chip low-power ADC for high speed applications can be a challenge. Furthermore, as the necessary bandwidth increases due to higher imager resolutions, it becomes increasingly difficult to design a single ADC with a sufficiently high signal-to-noise ratio.

At least some of these difficulties can be overcome by incorporating either a multi-channel ADC or several ADCs in parallel. For example, a so-called massive-parallel ADC could be employed whereby one ADC channel is provided for each column of the imaging array of a CMOS imager.

There are many different types of ADC known in the art. One of the simplest configurations is called the digital ramp ADC, wherein the output of a free running binary counter is connected to the input of a digital-to-analog converter (DAC). As the counter counts up with each clock pulse, the DAC outputs a slightly higher voltage. This voltage is compared against the input voltage by a comparator. If the input voltage is greater than the DAC output, the counter will continue counting normally. However, eventually the DAC output will exceed the input voltage, at which point the ADC circuit output is updated using the binary count output by the counter, and the counter is reset ready for the next input voltage, i.e. the DAC output ramps up to whatever level the analog input signal is at and the binary number corresponding to that level is output, before the counter is reset and the process starts again for the next analog input signal. However, the variations in sample time with this type of ADC make it unsuitable for some applications. Furthermore, the counter has to keep counting from zero for each analog input signal. Therefore sampling of the analog signal is relatively slow.

One way of addressing the above-mentioned disadvantages of the digital ramp ADC is to use a so-called successive approximation ADC. Referring to FIG. 1 of the drawings, the principal components of a successive approximation ADC are a comparator 10 with inputs for receiving the analog input signal $V_{in}$ and the output of a DAC 12, and a digital controller 14. The only change in this design relative to the digital ramp ADC is a special counter circuit known as a "successive approximation register". Instead of counting up in a binary sequence, this register counts by trying all values of bits starting with the most significant bit and finishing at the least significant bit. Throughout the count process, the register monitors the comparator's output to see if the binary count is less than or greater than the analog signal input, adjusting the bit values accordingly. In this case, the DAC 12 is controlled by a digital block 14 that tries to approximate the input voltage as well as possible based on the previous comparator output. This well-known architecture is relatively power efficient and, because the DAC 12 output converges on the analog input signal in much larger steps than with the zero-to-full count sequence of the regular counter of the digital ramp ADC, sampling of the analog signal is significantly faster. However, the DAC output depends on the input signal and thus, a separate DAC is needed for every ADC channel. In a massive-parallel system, this is unattractive since all the DACs have to be matched to achieve a uniform system response, and this is relatively difficult.

The use of a DAC can be avoided altogether by substituting an analog ramping circuit and a digital counter with precise timing, as in a single slope ADC. Referring to FIG. 2, there is illustrated a known single-slope massive parallel ADC architecture comprising, for each column of an imaging array, a comparator 10a, b, c with inputs for receiving a respective analog input signal $V_{in}$ and the output of an op-amp circuit or ramp generator 16. The output of each comparator 10 is fed to a respective latch and digital control module 18a, b, c for generating respective digital outputs. The output of a digital counter 20 is connected to each latch and digital control module 18.

The ramp generator 16 generates a sawtooth waveform which is then compared with an analog input $V_{in}$ by a respective comparator 10. The time it takes for the sawtooth waveform to exceed the input signal voltage is measured by means of the digital counter 20 clocked with a precise-frequency square wave (usually from a crystal oscillator). When the input voltage $V_{in}$ is greater than the ramp generator output, the ramp generator 16 is allowed to charge a capacitor thereof in a linear fashion. Meanwhile, the counter 20 is counting up at a rate fixed by the precision clock frequency. When the capacitor reaches the maximum input voltage level (corresponding to the maximum counter value of block 20), a final output is generated, the capacitor is discharged back to zero, in response to which the counter 20 is cleared and the ramp generator 16 is allowed to ramp up the voltage once again.

The architecture described above enables the use of a large number parallel channels by using a central ramp generator 16 and digital counter 20, which can be connected to a large number of comparators 10 and digital latches 18. The advantage of this approach is that the amount of circuitry required for each ADC channel is relatively low, primarily only a comparator 10 and a latch 18. This is essential for application in CMOS imagers, where every ADC channel has to fit within a pixel pitch width. Moreover, as the only analog component per channel is a comparator, it is relatively easy to ensure a uniform transfer function for all ADC channels. In theory, only the comparator offset can cause non-uniformities, and this can be reduced using dynamic offset cancellation techniques. It is for these reasons, among others, that the so-called column-parallel ADC architectures mostly use single-slope ADCs. However, the main disadvantage of the single-slope architecture is that it is relatively slow which results in relatively high power consumption. For each ADC channel, an n-bit A/D conversion takes $2^n$ comparator decisions. A detailed analysis of comparator operation has demonstrated that it is most efficient to implement it with a preamp and regenerative latch, where the regenerative latch consumes the most power. In a latch, the power consumption is proportional to the number of comparator decisions per unit time. More generally, a conventional massive-parallel ADC will contain a large number of comparators, which will consume most of the power required by the ADC. Thus, reducing the comparator power consumption is the key to reducing the ADC power consumption. In other words, it is advantageous to minimize the number of comparator decisions in order to minimize power consumption.

Although the successive approximation ADC described above can perform an A/D conversion of n bits using only n comparator decisions, so that it can be made more power efficient than the known single-slope architectures, the requirement for a DAC for each ADC channel makes it unattractive for use in a massive-parallel system because, as explained above, all of the DACs have to be matched to achieve a uniform system response, and this is difficult.

SUMMARY OF THE INVENTION

It is therefore an object of the present invention to provide an ADC which is more power efficient than conventional single-slope ADCs but which does not require the provision of a separate DAC for each ADC channel, as is required in a conventional successive approximation ADC.

In accordance with the present invention, there is provided an analog-to-digital converter (ADC) having an input range, the ADC comprising means for receiving an analog input signal, ramp generating means for generating a plurality of ramp signals covering at least partially non-overlapping sub-ranges of said input range, selection means for selecting one of said ramp-signals whose sub-range includes the value of said analog input signal, a comparator for comparing said analog input signal with said selected ramp signal, and means, operating under the control of said comparator, for outputting a digital representation of said analog input signal.

Thus, an ADC according to the present invention, enables the analog input signal to be converged on the ramp generator output more quickly than in conventional single-slope ADCs, because the ramp signal does not necessarily have to start from zero for each comparison process. Therefore, a more power efficient ADC can be implemented without the need to provide a DAC for each ADC channel.

Also in accordance with the present invention, there is provided a method of performing an analog-to-digital conversion in respect of an analog input signal, the method comprising receiving an analog input signal, generating a plurality of ramp signals covering at least partially non-overlapping sub-ranges of said input range, selecting one of said ramp-signals whose sub-range includes the value of said analog input signal, comparing said analog input signal with said selected ramp signal, and means, and outputting a digital representation of said analog input signal.

Preferably, the ADC comprises a single-slope ADC, wherein each of said sub-ranges of said ramp signals is substantially non-overlapping. A separate ramp generator is preferably provided to generate each ramp signal. Each ramp generator may comprise a digital-to-analog converter configured to ramp the output voltage thereof up in steps. In this case, the DACs are beneficially matched in order to achieve a substantially uniform system response. In an alternative embodiment, a single 'coarse' resistor ladder may be used, to which a plurality of fine resistor ladders are connected that generate the respective ramp signals. The advantage of using such a shared resistor ladder is that matching of the DAC's is automatically ensured.

In a preferred embodiment, switch means are provided between the outputs of said ramp generating means and the comparator input for receiving said selected ramp signal, said switch means being configured to selectively connect said selected ramp signal, from among said outputs of said ramp generating means, to said comparator input. Said means for outputting a digital representation of said analog input signal beneficially comprises a digital latch and counter means, and said switch is preferably under the control of an output of said digital latch and counter means.

In a preferred embodiment, the ramp signal including the value of the analog input signal is determined by comparing the maximum ramp voltage of each ramp signal with said analog input signal.

The present invention extends to a CMOS image sensor comprising a plurality of pixels, arranged in a matrix comprising rows and columns, and at least one readout circuit for reading out electrical signals generated by said pixels, said readout circuit comprising at least one analog-to-digital converter (ADC) having an input range, the ADC comprising means for receiving an electrical signal from a pixel, ramp generating means for generating a plurality of ramp signals covering at least partially non-overlapping sub-ranges of said input range, selection means for selecting one of said ramp-signals whose sub-range includes the value of said electrical signal, a comparator for comparing said electrical signal with said selected ramp signal, and means, operating under the control of said comparator, for outputting a digital representation of said electrical signal.

In a preferred embodiment, the CMOS image sensor comprises a plurality of readout circuits, each comprising an ADC as defined above. In one exemplary embodiment of the invention, each column of said matrix may share a readout circuit, wherein each readout circuit comprises an ADC as defined above.

These and other aspects of the present invention will be apparent from, and elucidated with reference to, the embodiment described herein.

BRIEF DESCRIPTION OF THE DRAWINGS

An embodiment of the present invention will now be described by way of example only and with reference to the accompanying drawings, in which.

DETAILED DESCRIPTION OF EMBODIMENT

Figure 1:
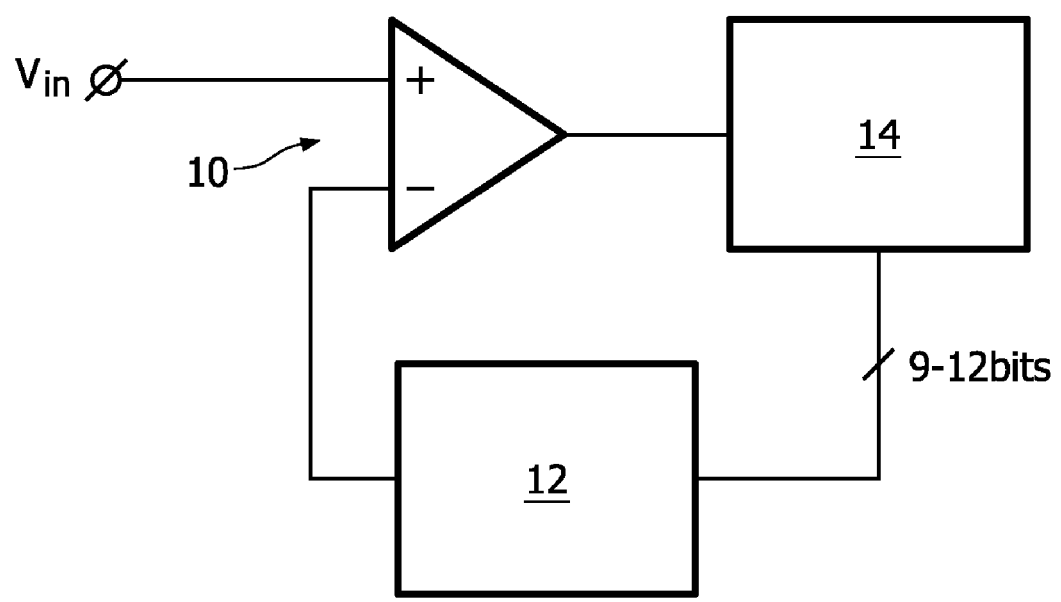
FIG. 1 is a schematic block diagram illustrating the principal component of a successive approximation ADC according to the prior art.
Figure 2:
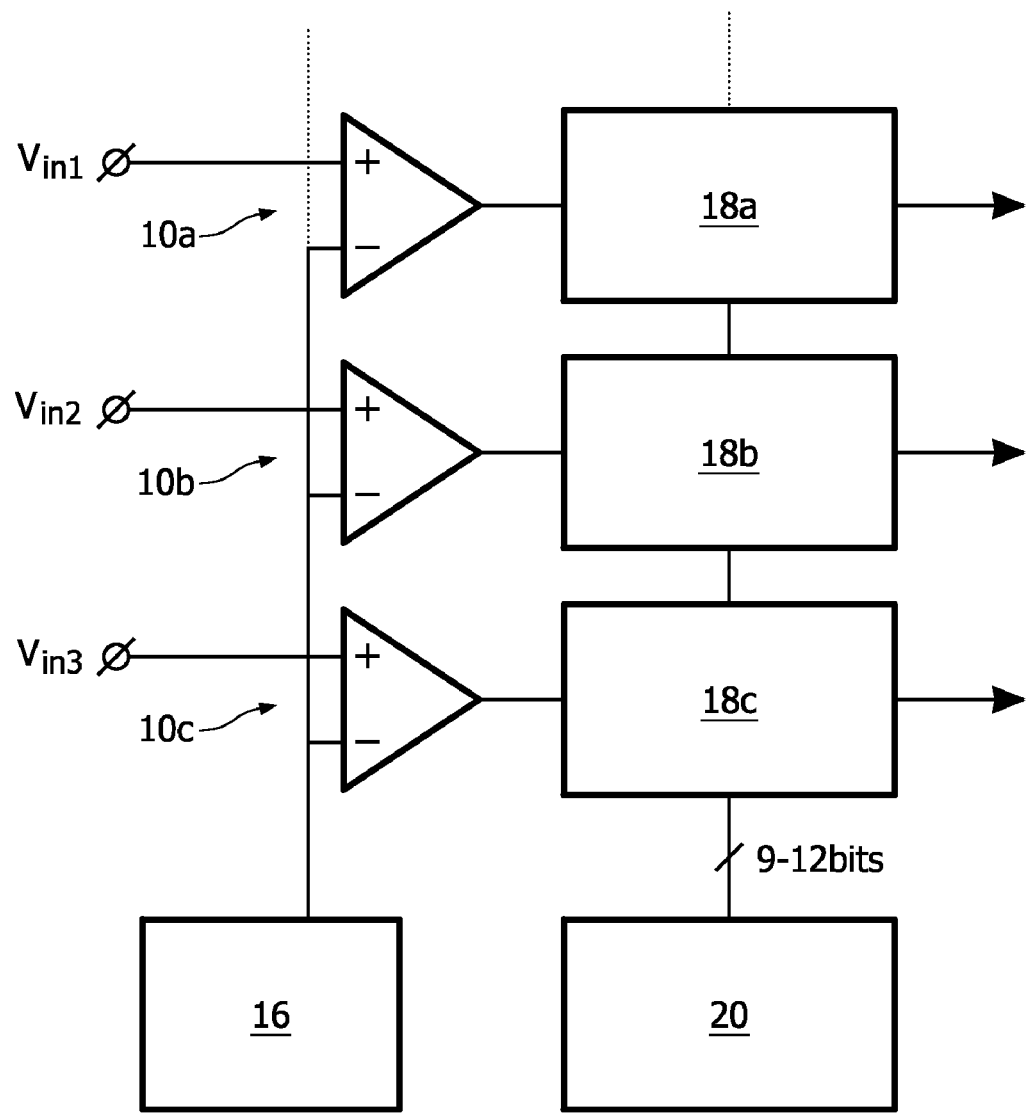
FIG. 2 is a schematic block diagram illustrating the principal components of a single-slope massive-parallel ADC architecture according to the prior art.
Figure 3:
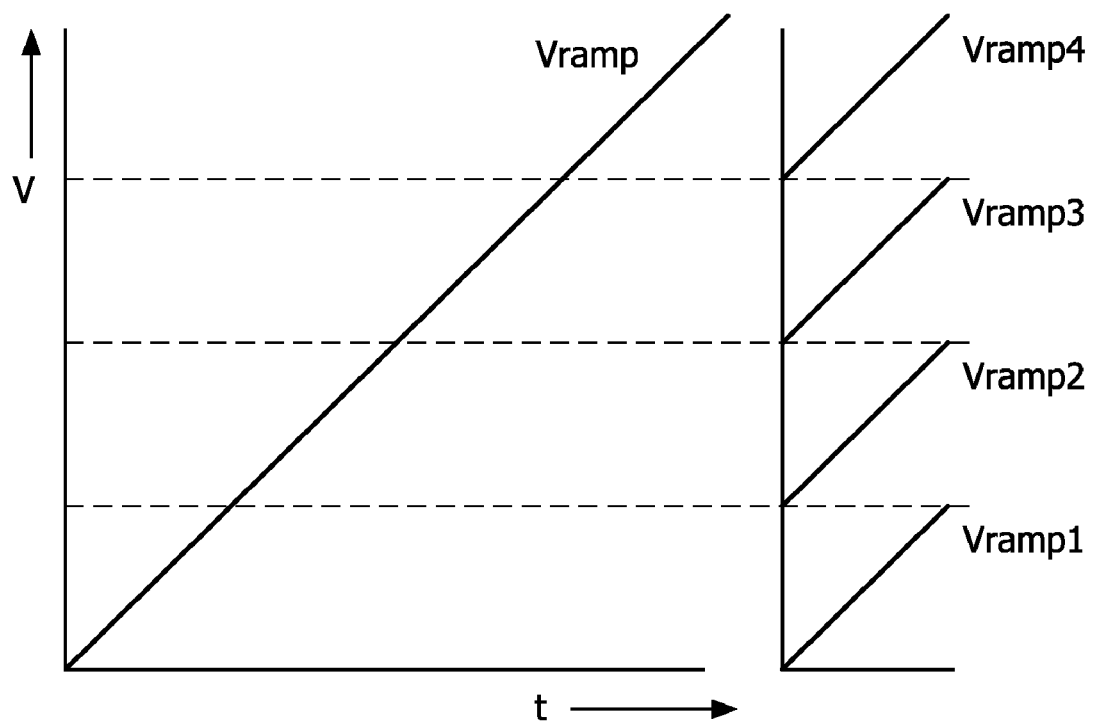
FIG. 3 is a timing diagram illustrating schematically the principle of a multiple-ramp single-slope ADC architecture according to an exemplary embodiment of the present invention.

Thus, as explained above, one of the main problems associated with a conventional single-slope ADC is that it takes a relatively long time to perform the comparison of the analog input signal with the ramp voltage. Therefore, in order to speed up this comparison process in accordance with an exemplary embodiment of the present invention, the single ramp signal is replaced with a number of (e.g. 4) smaller ramp signals, which comprise non-overlapping sub-ranges of the complete input range. This principle is illustrated in FIG. 3 of the drawings. If it can be relatively quickly determined to which of the ramp signals an input signal belongs, i.e. in which of the plurality of voltage ranges defined by the ramp signals the analog input voltage falls, the time taken to compare the input signal with the ramps signal can be reduced by a factor of n (where n is the number of ramp signals) by running the ramp signals simultaneously, connecting the right ramp signals to each comparator and performing the comparison processes for several analog input signals at the same time.

Figure 4:
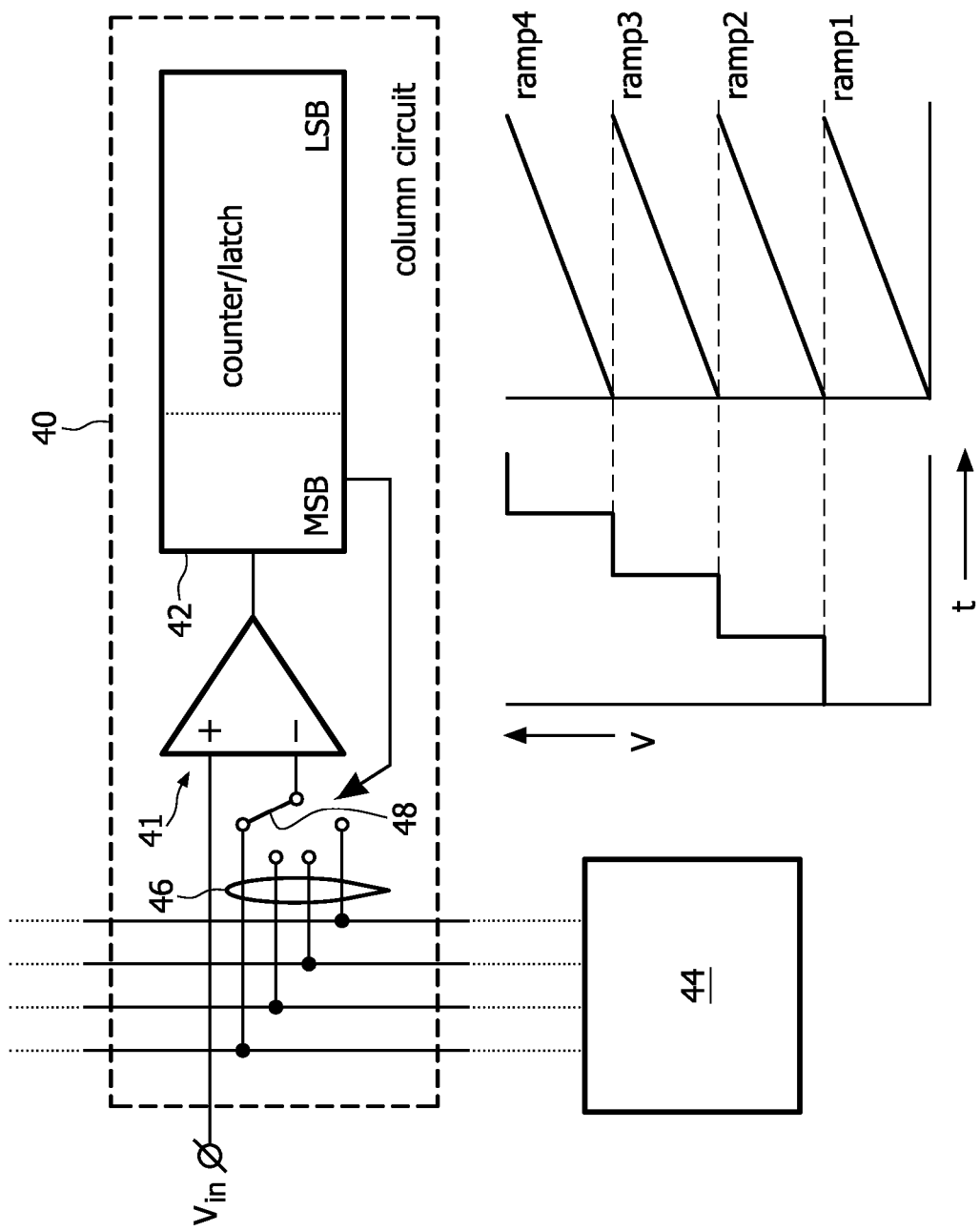
FIG. 4 is a schematic block diagram illustrating the principal components of a multiple-ramp single-slope ADC architecture according to an exemplary embodiment of the present invention.

This approach is very well suited for use in the massive-parallel ADC architecture described above, as illustrated in FIG. 4 of the drawings. As shown, a column readout circuit 40 according to an exemplary embodiment of the present invention comprises a comparator 41 having a first input for receiving the analog input signal $V_{in}$ and a second input for receiving a selected ramp signal $V_{ramp1,2,3,4}$. The output of the comparator is connected to a digital latch and counter module 42, as in the conventional massive-parallel single-slope ADC architecture.

A bank of four matched DACs 44 is provided to generate the four respective ramp signals. Ramp signals are generated in a similar manner to that described above with reference to the digital ramp ADC in that, starting from the lowest voltage of the respective sub-range of the ramp signal, with each clock pulse, the respective DAC outputs a slightly higher voltage until it reaches the highest voltage of the respective sub-range. Thus, the ramp signals are generated centrally and distributed to all ADC channels 46.

In the first phase of the A/D conversion process, every channel has to determine the voltage range (i.e. the sub-range of the full input range) in which the voltage of the analog input signal falls. This can be done by putting the maximum ramp voltage of each defined sub-range on each of the ramp outputs 46 and comparing these voltages to the input signal in every channel (i.e. one channel for each column of the imaging matrix in this exemplary embodiment). Based on the outcome of this process, the comparator of each ADC channel is connected, via the switch 48, to the corresponding ramp output. In an alternative embodiment, it may be more preferable to output the maximum ramp voltage of each sub-ramp through one of the ramp outputs, thus creating another 'coarse' single-slope A/D conversion. After the result of this 'coarse' A/D conversion is stored in the digital memory, switch 48 connects the comparator to the corresponding sub-ramp, thus preventing any switching transients being introduced that might falsely trigger the comparator.

In the second phase of the A/D conversion process, a single-slope A/D conversion is performed with all of the ramp voltages running in parallel. A/D conversion is performed in the same way as it is performed in a conventional single-slope ADC architecture (as described above) but with the smaller sub-range ramp signals rather than the ramp signal defining the full input range.

The proposed approach can reduce the power consumption of the comparator at column-level and, particularly in high resolution imagers, this is attractive because of the large number of columns.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. An analog-to-digital converter (ADC) having an input range, the ADC comprising:
    means for receiving an analog input signal (Vin) having a value;
    ramp generating means for generating simultaneously a plurality of n ramp signals, wherein n is the number of ramp signals ($Vramp_{1,2,...n}$) covering non-overlapping sub-ranges of a complete range of the input range;
    selection means for selecting one of said plurality of n ramp-signals ($Vramp_{1,2,...n}$) whose sub-range includes the value of said analog input signal;
    a comparator for comparing said analog input signal (Vin) with said selected ramp signal (Vramp); and
    means, operating under the control of said comparator in response to the comparison of the analog input signal with the selected ramp signal of the plurality of n ramp signals, for outputting a digital representation of the value of said analog input signal.

2. The ADC according to claim 1, further comprising a single-slope ADC, wherein each of said sub-ranges of said plurality of n ramp signals is substantially non-overlapping.

3. The ADC according to claim 1, wherein said ramp generating means comprises a separate ramp generator to generate each ramp signal of the plurality of n ramp signals.

4. The ADC according to claim 3, further wherein each separate ramp generator comprises a digital-to-analog converter (DAC) configured to ramp a corresponding output voltage thereof up in steps.

5. The ADC according to claim 4, wherein the DACs are matched.

6. The ADC according to claim 1, further comprising switch means provided between the outputs of said ramp generating means and the comparator input for receiving said selected ramp signal, wherein said switch means is configured to selectively connect said selected ramp signal, from among said outputs of said ramp generating means, to said comparator input.

7. The ADC according to claim 6, wherein said means for outputting a digital representation of said analog input signal comprises a digital latch and counter means, and wherein said switch operates under the control of an output of said digital latch and counter means.

8. The ADC according to claim 1, wherein the ramp signal including the value of the analog input signal is determined by comparing a maximum ramp voltage of each of the plurality of n ramp signals with said analog input signal.

9. A method of performing an analog-to-digital conversion with respect of an analog input signal having an input range, the method comprising:
    receiving an analog input signal having a value;
    generating simultaneously a plurality of n ramp signals, wherein n is the number of ramp signals ($Vramp_{1,2,...n}$) covering non-overlapping sub-ranges of a complete range of the input range;

selecting one of said plurality of n ramp-signals (Vramp$_{1,2,\ldots n}$) whose sub-range includes the value of said analog input signal;

comparing said analog input signal with said selected ramp signal; and outputting, in response to the comparison of the analog input signal with the selected ramp signal of the plurality of n ramp signals, a digital representation of the value of said analog input signal.

10. A CMOS image sensor comprising a plurality of pixels, arranged in a matrix comprising rows and columns, and at least one readout circuit for reading out electrical signals generated by said pixels, said readout circuit comprising at least one analog-to-digital converter (ADC) having an input range, the ADC comprising means for receiving an electrical signal from a pixel, the electrical signal having an analog value, ramp generating means for generating simultaneously a plurality of n ramp signals, wherein n is the number of ramp signals (Vramp$_{1,2\ldots n}$) covering non-overlapping sub-ranges of a complete range of input range, selection means for selecting one of said plurality of n ramp-signals (Vramp$_{1,2,\ldots n}$) whose sub-range includes the value of said electrical signal, a comparator for comparing said electrical signal with said selected ramp signal (Vramp), and means, operating under the control of said comparator in response to the comparison of the electrical signal with the selected ramp signal of the plurality of n ramp signals, for outputting a digital representation of the value of said electrical signal.

11. A CMOS image sensor comprising a plurality of pixels, arranged in a matrix comprising rows and columns, and at least one readout circuit for reading out electrical signals generated by said pixels, said readout circuit comprising at least one analog-to-digital converter (ADC) having an input range, the ADC comprising means for receiving an electrical signal from a pixel, ramp generating means for generating a plurality of ramp signals covering at least partially non-overlapping sub-ranges of said input range, selection means for selecting one of said ramp-signals whose sub-range includes the value of said electrical signal, a comparator for comparing said electrical signal with said selected ramp signal, and means, operating under the control of said comparator, for outputting a digital representation of said electrical signal, further comprising a plurality of readout circuits, each comprising an ADC according to claim 1.

12. A CMOS image sensor comprising a plurality of pixels, arranged in a matrix comprising rows and columns, and at least one readout circuit for reading out electrical signals generated by said pixels, said readout circuit comprising at least one analog-to-digital converter (ADC) having an input range, the ADC comprising means for receiving an electrical signal from a pixel, ramp generating means for generating a plurality of ramp signals covering at least partially non-overlapping sub-ranges of said input range, selection means for selecting one of said ramp-signals whose sub-range includes the value of said electrical signal, a comparator for comparing said electrical signal with said selected ramp signal, and means, operating under the control of said comparator, for outputting a digital representation of said electrical signal, wherein each column of said matrix shares a readout circuit, and wherein each readout circuit comprises an ADC according to claim 1.

* * * * *